United States Patent
Legates et al.

(10) Patent No.: US 7,825,665 B1
(45) Date of Patent: Nov. 2, 2010

(54) FEEDBACK CIRCUITRY AND METHODOLOGY FOR SWITCHING CIRCUIT CAPABLE OF GENERATING BOTH POSITIVE AND NEGATIVE OUTPUT VOLTAGES

(75) Inventors: Bryan Avery Legates, Sunnyvale, CA (US); Albert Mien-Yee Wu, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 217 days.

(21) Appl. No.: 11/717,647

(22) Filed: Mar. 14, 2007

(51) Int. Cl.
*G01R 31/02* (2006.01)
(52) U.S. Cl. ...................................................... 324/416
(58) Field of Classification Search ................. 324/416
See application file for complete search history.

(56) References Cited

U.S. PATENT DOCUMENTS

| | | | |
|---|---|---|---|
| 5,019,817 A * | 5/1991 | Ryder | 341/129 |
| 5,438,258 A * | 8/1995 | Maruyama | 324/142 |
| 6,359,449 B1 * | 3/2002 | Reining et al. | 324/692 |
| 6,369,726 B1 * | 4/2002 | Nagaraj et al. | 341/122 |
| 6,501,282 B1 * | 12/2002 | Dummermuth et al. | 324/679 |
| 6,735,302 B1 * | 5/2004 | Caine et al. | 379/405 |
| 6,770,938 B1 * | 8/2004 | Fliesler et al. | 257/357 |
| 6,894,501 B1 * | 5/2005 | Flasck et al. | 324/416 |
| 6,940,271 B2 * | 9/2005 | West | 324/158.1 |
| 7,317,298 B1 * | 1/2008 | Burns et al. | 320/107 |
| 7,375,515 B2 * | 5/2008 | Omagari et al. | 324/249 |
| 2004/0119448 A1 * | 6/2004 | Wiegand et al. | 323/223 |

* cited by examiner

*Primary Examiner*—Jeff Natalini
(74) *Attorney, Agent, or Firm*—McDermott Will & Emery LLP

(57) ABSTRACT

Circuitry arranged for sensing a variable polarity signal comprises an input node supplied with the variable polarity signal to produce an input signal. A first sensing circuit is responsive to the input signal having a first polarity for producing a first signal. A level shifting circuit is responsive to the input signal having a second polarity for shifting a level of the input signal to produce a shifted signal of the first polarity at a level determined by the input signal.

19 Claims, 3 Drawing Sheets

FOR POSITIVE OUTPUT:

FOR NEGATIVE OUTPUT:

(BACKGROUND)

FOR POSITIVE OUTPUT:

FOR NEGATIVE OUTPUT:

(BACKGROUND)

FOR POSITIVE OUTPUT:

FOR NEGATIVE OUTPUT:

FEEDBACK CIRCUITRY AND METHODOLOGY FOR SWITCHING CIRCUIT CAPABLE OF GENERATING BOTH POSITIVE AND NEGATIVE OUTPUT VOLTAGES

TECHNICAL FIELD

The subject matter of this disclosure relates to power supply circuits, and more particularly to circuitry and methodology for providing a feedback scheme for an integrated circuit (IC) having a switching circuit, such as a converter or switching regulator, that can be used to generate both positive and negative output voltages. The feedback scheme has particular utility in the context of single-pin feedback of positive and negative output voltages.

BACKGROUND

Some switching circuits, such as converters or switching regulators, may be used to generate both positive and negative output voltages. For example, the LT®3471 dual switching regulator manufactured by Linear Technology Corporation, the assignee of the present application, includes two channels that may be configured as two boost converters, a boost converter and an inverter, or two inverters. Accordingly, each channel may be configured into a non-inverting boost regulator to produce positive output voltage or into an inverter to produce negative output voltage.

To support both positive and negative output voltages, this IC requires positive feedback pin FBP and negative feedback pin FBN for each channel and a reference pin Vref that may be shared by the channels. As illustrated in FIG. 1, the positive and negative feedback pins FBP and FBN are respectively connected to non-inverting and inverting inputs of an error amplifier EA that produces control voltage Vc at its output. Positive or negative output voltage Vout+ or Vout− is sensed using an external resistor divider composed of resistors R1 and R2. For the positive output, FBP is connected to the reference voltage pin Vref, FBN is connected between R1 and R2. For the negative output, FBN is tied to ground and FBP is connected between R1 and R2. If a negative output is sensed, a change in phase is provided.

Another example is a feedback scheme used in the LT®1370 switching regulator manufactured by Linear Technology Corporation, the assignee of the present application. This regulator can regulate positive or negative output voltage. As illustrated in FIG. 2, it has positive and negative feedback pins FB and NFB respectively provided for positive and negative output voltage sensing. Also, it has negative and positive error amplifiers EA1 and EA2, respectively. NFB is connected to the inverting input of the negative error amplifier EA1. The non-inverting input of EA1 is tied to ground. Via diode D, the output of EA1 is coupled to FB connected to the inverting input of EA2. The non-inverting input of EA2 is supplied with a 1.25V reference voltage.

Positive or negative output voltage Vout+ or Vout− is sensed using an external resistor divider composed of resistors R1 and R2. For positive outputs, NFB is shorted to FB which is regulated to 1.25V by the regulator loop. The output of EA1 is driven low, so the diode D is off. For negative outputs, EA1 drives FB to 1.25V so that NFB is regulated to 0V by the regulator loop.

To reduce the number of external pins provided in a chip for controlling a switching circuit capable of producing positive and negative output voltages, it would be desirable to develop a feedback scheme using a single pin for sensing both positive and negative output voltages.

SUMMARY OF THE DISCLOSURE

In accordance with one aspect of the disclosure, circuitry arranged for sensing a variable polarity signal comprises an input node supplied with the variable polarity signal to produce an input signal. A first sensing circuit is responsive to the input signal having a first polarity for producing a first signal. A level shifting circuit is responsive to the input signal having a second polarity for shifting a level of the input signal to produce a shifted signal of the first polarity at a level determined by the input signal. The input node may be a pin extending from a package housing the circuitry.

For example, the first sensing circuit may be responsive to a positive voltage at the input, and the level shifting circuit may be configured to shift a negative voltage level at the input to a positive voltage level corresponding to the negative voltage level. The level shifting circuit may include a PMOS or PNP circuit.

In accordance with an embodiment of the disclosure, a switch may be coupled to the input for supplying the input signal to the first sensing circuit if the input signal has a first polarity, and for supplying the input signal to the level shifting circuit if the input signal has a second polarity. A threshold detector may compare the input signal with a pre-determined threshold value to control the switch.

A second sensing circuit may be responsive to a shifted signal at an output of the level shifting circuit for producing a second signal. An output circuit may be responsive to the first and second signals to produce an output signal.

The first sensing circuit may be a differential amplifier that compares the input signal with a first reference signal to produce the first signal that represents a difference between the input signal and the first reference signal. The second sensing circuit may be a differential amplifier that compares the shifted signal with a second reference signal to produce the second signal that represents a difference between the shifted signal and the second reference signal.

The output circuit may include a transconductance amplifier to produce an output current value. If a positive output is being sensed, the negative sensing circuitry is disabled, so there is no second signal generated; similarly, if a negative output is being sensed, the positive sensing circuitry is disabled, so there is no first signal generated.

In accordance with another aspect of the disclosure, a system for controlling a switching circuit having an output for producing an output voltage of first and second polarities comprises a feedback circuit that receives the output voltage via a single input and produces a control signal responsive to the output voltage to control switching of the switching circuit. The feedback circuit includes:
- a first sensing circuit responsive to an input signal when the output voltage has the first polarity for producing a first signal representing the output voltage of the first polarity,
- a voltage modification circuit responsive to the input signal when the output voltage has the second polarity for modifying a voltage level of the input signal from a first voltage level of the second polarity to a second voltage level of the first polarity representing the first voltage level, and
- an output circuit responsive to output signals of the first sensing circuit and the voltage modification circuit for producing the control signal.

The feedback circuit may further comprise a switch for supplying the input signal to the first sensing circuit when the output voltage has the first polarity, and for supplying the input signal to the voltage modification circuit when the output voltage has the second polarity. A threshold detector may compare the input signal with a threshold level to control the switch.

The feedback circuit may further include a second sensing circuit coupled to the voltage modification circuit for producing a second signal representing the output voltage of the second polarity.

The first sensing circuit may compare the input signal with a first reference value to produce the first signal, and the second sensing circuit may compare an output signal of the voltage modification circuit with a second reference value to produce the second signal. The output circuit may produce the output signal representing a difference between the first signal and the second signal.

In accordance with a method of the present disclosure, the following steps are carried out for sensing signals at an output of a circuit configurable for forming an output signal having a first or second polarity:

sensing the output signal to produce a sensed signal having a polarity corresponding to the polarity of the output signal, if the sensed signal has a first polarity, producing a respective signal of the first polarity and if the sensed signal has a second polarity, shifting a voltage level of the sensed signal by a preset voltage value from a first voltage level of the second polarity to a second voltage level of the first polarity.

For example, the step of shifting may be carried out if the sensed signal has a negative polarity.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using the example of a switching regulator. It will become apparent, however, that the concept of the disclosure is applicable to sensing an output of any circuit capable of producing both positive and negative output signals.

Figure 1:
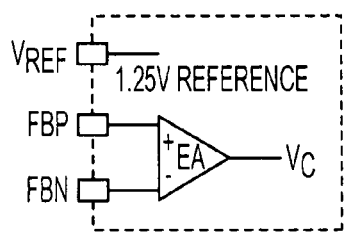
FIGS. 1 and 2 illustrate conventional feedback circuits in switching regulators.
Figure 1:
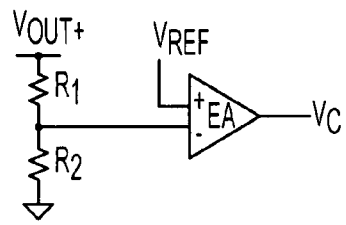
Figure 1:
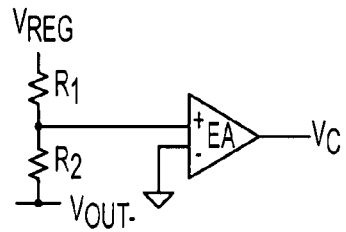
Figure 2:
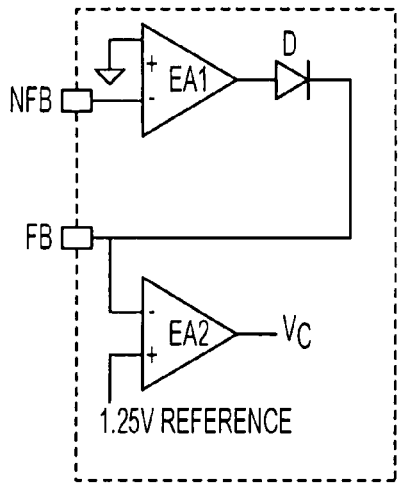
Figure 2:
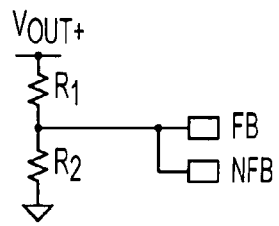
Figure 2:
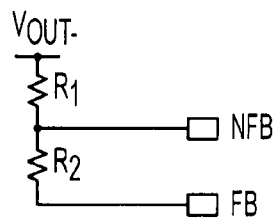
Figure 3:
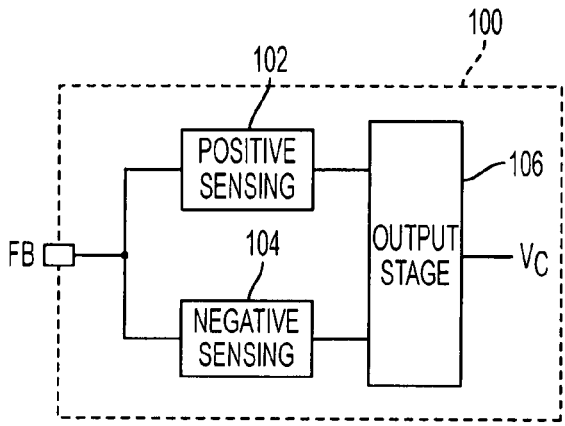
FIG. 3 illustrates general topology of a single-pin feedback circuit of the present disclosure.
Figure 3:
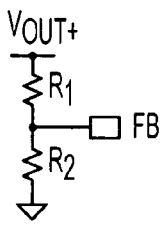
Figure 3:
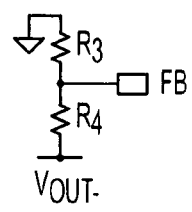

FIG. 3 schematically illustrates a single-pin feedback circuit 100 of the present disclosure for controlling a switching regulator capable of producing positive and negative output voltages. The circuit 100 has a feedback pin FB that may protrude outside a package housing the regulator. The FB pin is supplied with sensed positive output voltage Vout+ or sensed negative output voltage Vout−. For example, the positive output voltage Vout+ may be produced when the switching regulator is configured into a boost regulator topology, and the negative voltage Vout− may be generated when the switching regulator is configured into an inverter topology.

The positive output voltage Vout+ may be sensed using a resistor divider composed of resistor R1 coupled to a source of voltage Vout+ and grounded resistor R2. The negative output voltage Vout− may be sensed using a resistor divider composed of grounded resistor R3 and resistor R4 coupled to a source of voltage Vout−. The feedback pin FB may be connected to a common node between resistors of the resistor dividers.

Based on a variable polarity signal supplied to the feedback pin FB, the feedback circuit 100 generates a control signal Vc that can be used to control switching of the switching regulator to regulate the output voltage Vout+ or Vout−. For example, the control signal Vc may be supplied to an error amplifier that compares it with a preset reference signal to generate an error signal for controlling a pulse-width-modulation (PWM) switching control circuit. The control signal Vc may be generated as a voltage value Vc or as a current value representing the voltage Vc.

The feedback circuit 100 may be provided on a switching regulator chip. As disclosed in more detail below, this circuit requires only a single external pin to support its operation. The sensing resistor dividers R1, R2 and R3, R4 may be arranged outside of the chip or may be provided on the chip, together with the feedback circuit 100.

The feedback circuit 100 comprises a positive sensing channel 102 and a negative sensing channel 104. Their inputs are coupled to the input feedback pin FB for respectively sensing positive and negative polarity input signals developed at the feedback pin FB. The outputs of the positive and negative sensing channels 102 and 104 are connected to an output stage 106 that produces a control signal Vc.

Figure 4:
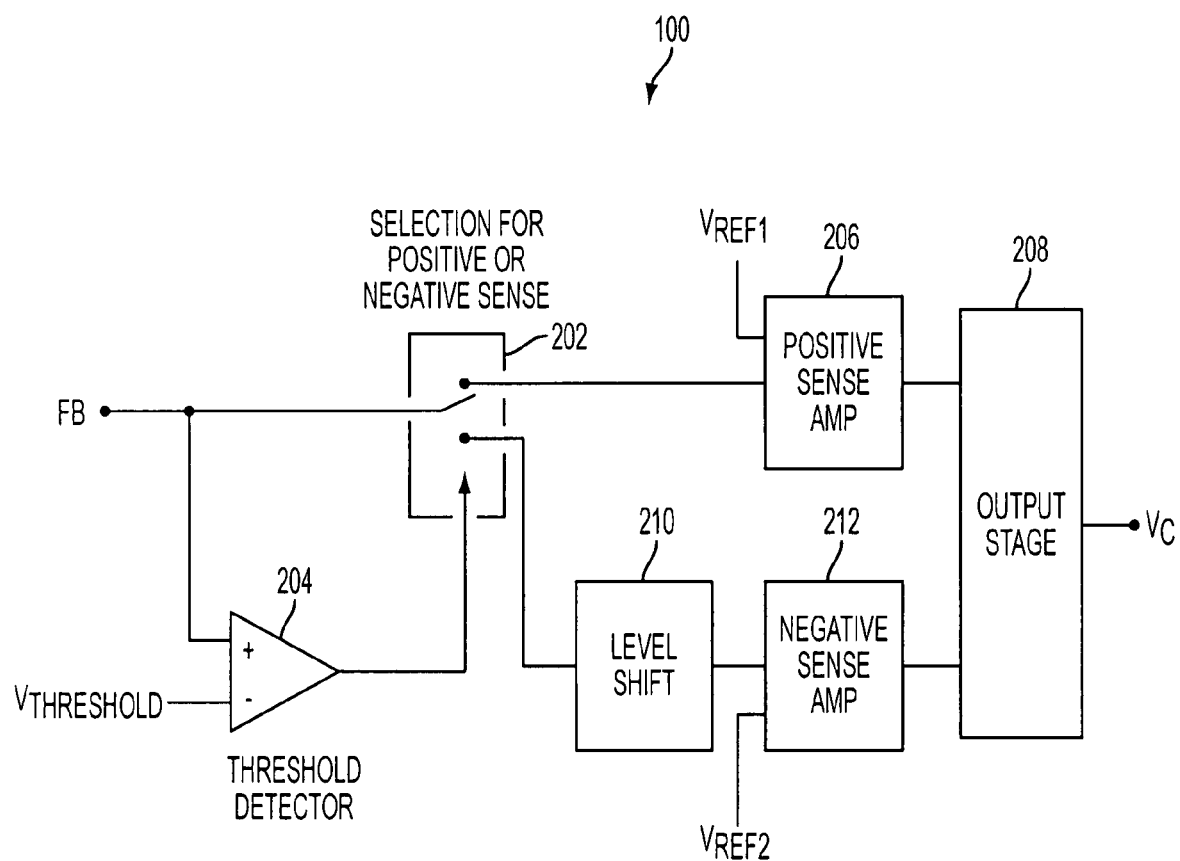
FIG. 4 is a block-diagram illustrating an exemplary embodiment of the feedback circuit of the present disclosure.

FIG. 4 shows a block-diagram illustrating an exemplary embodiment of the single-pin feedback circuit 100 of the present disclosure. The feedback pin FB may be connected to a switching device 202 that connects the positive sensing channel to the FB pin if an input voltage detected at the FB pin has a positive polarity, and connects the negative sensing channel to the FB pin if the detected FB input voltage has a negative polarity. The switching device 202 may be controlled by a threshold detector 204 that compares the input voltage at the FB pin with a threshold voltage selected to detect when the input voltage becomes well above ground.

When a switching regulator that generates the sensed output voltage Vout starts up, the input voltage at the FB pin is near the ground. Therefore, initially, the switching device 202 may connect the FB pin to the negative sensing channel. When the FB input voltage exceeds the threshold voltage, the threshold detector 204 detects that the voltage developed at the FB pin is well above ground and produces a control signal to switch the FB pin to the positive sensing channel.

The positive sensing channel may include a positive sensing amplifier 206 that compares the FB input voltage with a first reference voltage Vref1. For example, the positive sensing amplifier 206 may be a differential amplifier that produces a positive polarity signal representing a difference between the FB input voltage and the first reference voltage Vref1. The output signal of the positive sensing amplifier 206 may be supplied to an output stage 208 that produces a control signal Vc. For example, the output stage 208 may include a transconductance amplifier that produces current corresponding to the control voltage value Vc. Alternatively, the output stage may include a voltage amplifier that produces control voltage Vc. The reference voltage Vref1 may be selected so as to produce the control signal Vc that accurately represents any positive input voltage detected at the FB pin.

If the input voltage at the FB pin does not exceed the threshold voltage, the threshold detector 204 controls the switching device 202 to connect the FB pin to the negative sensing channel that includes a level shifter 210 and a negative sensing amplifier 212. When the FB input voltage is below ground, the level shifter 210 shifts the input level to produce a voltage above ground corresponding to the FB input voltage. The level shifter 210 may be configured to shift the input level by a preset value so as to transform a negative voltage at the FB pin into the corresponding positive voltage. As a result, the level shifter 210 produces a positive voltage that accurately represents any negative input voltage detected at the FB pin.

The output voltage produced by the level shifter 210 is supplied to the negative sensing amplifier 212 that compares this voltage with a second reference voltage Vref2. The negative sensing amplifier 212 may include a differential amplifier that produces a positive polarity signal representing a difference between the output voltage of the level shifter 210 and the second reference voltage Vref2. The output signal of the negative sensing amplifier 212 may be supplied to the output stage 208 that produces a control signal Vc. For example, the output stage 208 may include a transconductance amplifier. The reference voltage Vref2 may be selected to produce the control signal Vc that accurately represents any positive voltage developed at the output of the level shifter 210. For example, the first reference voltage Vref1 may be equal to the second reference voltage Vref2.

Hence, in response to an input signal of any polarity developed at the FB pin, the feedback circuit 100 produces a control signal Vc accurately representing the FB input signal. Therefore, a single FB pin is sufficient to support sensing of positive voltage Vout+ as well as negative voltage Vout− that may be produced at the output of a switching regulator.

Figure 5:
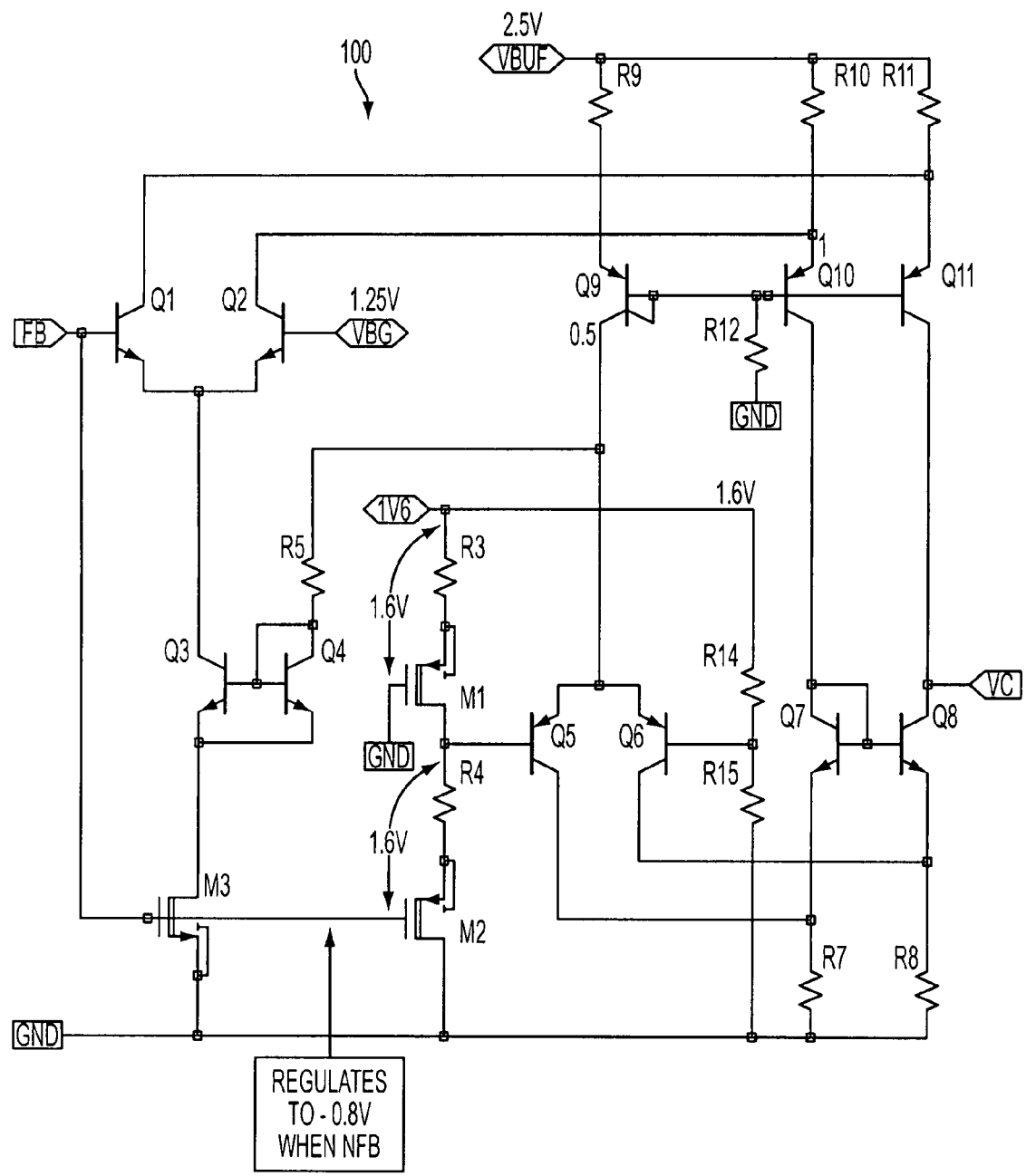
FIG. 5 is a circuit diagram illustrating exemplary implementation of the feedback circuit in FIG. 4.

FIG. 5 illustrates exemplary circuit implementation of the embodiment in FIG. 4. In this example, the feedback circuit 100 includes CMOS transistors M1-M3, bipolar transistors Q1-Q11 and resistors R1-R15. However, one skilled in the art would realize that the circuit 100 may also be implemented using only a CMOS or BiCMOS technology, or using only a bipolar technology.

The switching device 202 and the threshold detector 204 may be provided using a circuit including an NMOS transistor M3 and a pair of NPN transistors Q3 and Q4. The gate of M3 is connected to the feedback pin FB. A 20K resistor R5 may be coupled to the transistor Q4.

The positive sensing amplifier 206 may include a pair of NPN transistors Q1 and Q2 arranged in a differential amplifier configuration. The base of Q1 may be connected to the FB pin. The base of Q2 may be supplied with a 1.25V Bandgap reference voltage.

The level shifter 210 may comprise PMOS transistors M1 and M2 connected together with resistors R3 and R4 between the ground and a 1.6V reference voltage node. The 1.6 V reference voltage may be provided by boosting a Bandgap reference voltage. The gate of M2 may be connected to the gate of M3. The gate of M1 may be grounded. 20K resistors may be used as resistors R3 and R4.

The negative sensing amplifier 212 may include a pair of PNP transistors Q5 and Q6 arranged in a differential amplifier configuration. The base of Q5 is connected to the output of the level shifter M1, M2. The base of Q6 is supplied with the 1.6V reference voltage via a resistor divider R14, R15, which may be composed of 40K resistors.

The NPN differential pair Q1, Q2 and the PNP differential pair Q5, Q6 are connected to the output stage 208 that may be implemented using a transconductance amplifier including PNP transistors Q9-Q11 and NPN transistors Q7, Q8. The control signal Vc is produced at a node connected to collectors of Q8 and Q11. Resistors R9-R11 may be connected for supplying a 2.5V power supply voltage to emitters of transistors Q9-Q11, respectively. For example, R9 may be a 2K resistor, R10 and R11 may be 5K resistors. Bases of Q9-Q11 may be grounded via an 85K resistor R12. The emitters of transistors Q7 and Q8 may be grounded via 5K resistors R7 and R8, respectively.

For positive output voltages Vout+, the input voltage at the FB pin is initially at a level close to ground. As a result, the PNP differential pair Q5, Q6 is connected to the FB pin to drive the Vc pin. When, the FB input voltage becomes high enough to exceed the preset threshold voltage, the PNP pair Q5, Q6 turns off, and the NPN differential pair Q1, Q2 takes over and regulates the control signal Vc like a traditional error amplifier.

For negative output voltages Vout−, the NMOS transistor M3 is turned off and the PNP differential pair Q5, Q6 controls the Vc pin. The PMOS transistors M1, M2 and resistors R3, R4, provides level shifting by duplicating a 1.6V voltage ($V_{GS,M1}+V_{R3}$) across a circuit composed of the gate-source junction of M2 and resistor R4, where $V_{GS,M1}$ is the voltage between the gate and source of M1 and $V_{R3}$ is the voltage across R3. As a result, a −0.8V regulation point for the FB pin is created at the gate of M2. The transistors M1 and M2 may have identical drain current $I_D$, gate-source voltage $V_{GS}$, drain-source voltage $V_{DS}$ and drain-gate voltage $V_{DG}$ to accurately match each other at the regulation point.

It is noted that the resistor R5 plays an important role in how smoothly transition between the NPN and PNP pairs occurs. The value of R5 may be selected high enough to avoid zero output current at the Vc node during the transition, and low enough to ensure that the Q5, Q6 pair are completely cut off for positive outputs Vout+.

The level of the regulation point for negative outputs Vout− may be selected in accordance with a reference voltage supplied to the negative sense amplifier. For example, this level may be set at a half of the reference voltage, which may be made higher than the maximum threshold voltage $V_{TH,MAX}$ of a PMOS transistor in the level shifter so that enough voltage can be generated across R3 to ensure good matching of transistors M1 and M2, and resistors R3 and R4. The level of the regulation point may also be made lower than the minimum threshold voltage $V_{TH,MIN}$ of a PMOS transistor in the level shifter to keep M1 and M2 in saturation.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

What is claimed is:

1. Signal sensing circuitry arranged on a chip, for producing an output signal to control a circuit, the signal sensing circuitry comprising:
    an input node configured for receiving an input signal supplied from an output of the controlled circuit, the input signal having a variable polarity and being provided externally with respect to the chip,
    a first sensing circuit responsive to the input signal having a first polarity for producing a first signal, and
    a level shifting circuit responsive to the input signal having a second polarity for shifting a level of the input signal to produce a shifted signal of the first polarity at a level determined by the input signal.

2. The circuitry of claim 1, wherein the first sensing circuit is responsive to a positive voltage at the input node, and the level shifting circuit is configured to shift a negative voltage level at the input node to a positive voltage level corresponding to the negative voltage level.

3. The circuitry of claim 2, wherein the level shifting circuit includes a PMOS circuit.

4. The circuitry of claim 2, wherein the level shifting circuit includes a PNP circuit.

5. The circuitry of claim 1, further comprising a switch coupled to the input node for supplying the input signal to the first sensing circuit if the input signal has the first polarity, and for supplying the input signal to the level shifting circuit if the input signal has the second polarity.

6. The circuitry of claim 5, further comprising a threshold detector for comparing the input signal with a pre-determined threshold value to control the switch.

7. The circuitry of claim 1, further comprising a second sensing circuit responsive to the shifted signal for producing a second signal.

8. The circuitry of claim 7, further comprising an output circuit responsive to the first and second signals to produce the output signal.

9. The circuitry of claim 8, wherein the first sensing circuit is configured to compare the input signal with a first reference signal to produce the first signal proportional to a difference between the input signal and the first reference signal.

10. The circuitry of claim 9, wherein the second sensing circuit is configured to compare the shifted signal with a second reference signal to produce the second signal proportional to a difference between the shifted signal and the second reference signal.

11. The circuitry of claim 10, wherein the output circuit includes a transconductance amplifier to produce an output current value.

12. A system for controlling a switching circuit having an output for producing an output voltage of first and second polarities, comprising:
    a feedback circuit arranged on a chip and configured for receiving the output voltage provided externally with respect to the chip, via a single input node and responsive to the output voltage for producing a control signal to control switching of the switching circuit,
    the feedback circuit including:
    a first sensing circuit responsive to the output voltage sensed at the input node when the output voltage has the first polarity, for producing a first signal representing the output voltage of the first polarity,
    a voltage modification circuit responsive to the output voltage sensed at the input node when the output voltage has the second polarity, for modifying a voltage level of the output voltage from a first voltage level of the second polarity to a second voltage level of the first polarity representing the first voltage level, and
    an output circuit responsive to output signals of the first sensing circuit and the voltage modification circuit for producing the control signal.

13. The system of claim 12, wherein the feedback circuit further comprises a switch for supplying the output voltage to the first sensing circuit when the output voltage has the first polarity, and for supplying the output voltage to the voltage modification circuit when the output voltage has the second polarity.

14. The system of claim 13, wherein the feedback circuit further comprises a threshold detector for comparing the output voltage with a threshold level to control the switch.

15. The system of claim 12, wherein the feedback circuit further includes a second sensing circuit coupled to the voltage modification circuit for producing a second signal representing the output voltage of the second polarity.

16. The system of claim 15, wherein the first sensing circuit is configured for comparing the output voltage with a first reference value to produce the first signal, and the second sensing circuit is configured for comparing an output signal of the voltage modification circuit with a second reference value to produce the second signal.

17. A method of sensing signals using sensing circuitry arranged on a chip and having a node for receiving an output signal of a circuit configurable for forming the output signal having a first or second polarity, the output signal being provided externally with respect to the chip, the method comprising the steps of:
    sensing the output signal at the node,
    if the sensed output signal has a first polarity, producing a signal of the first polarity and
    if the sensed output signal has a second polarity, shifting a voltage level of the sensed output signal by a preset voltage value from a first voltage level of the second polarity to a second voltage level of the first polarity, and
    in response to the output signal sensed at the node, controlling the circuit for forming the output signal.

18. The method of claim 17, wherein the step of shifting is carried out if the sensed output signal has a negative polarity.

19. A switching regulator configured on a chip for producing an output voltage of first and second polarities, comprising:
    feedback circuitry coupled to a feedback node configured for receiving the output voltage of both the first polarity and the second polarity provided externally with respect to the chip,
    the feedback circuitry including:
    a first sensing circuit responsive to the output voltage sensed at the feedback node when the output voltage has the first polarity for producing a first signal representing the output voltage of the first polarity,
    a voltage modification circuit responsive to the output voltage sensed at the feedback node when the output voltage has the second polarity for modifying a voltage level of the output voltage from a first voltage level of the second polarity to a second voltage level of the first polarity representing the first voltage level, and
    an output circuit responsive to output signals of the first sensing circuit and the voltage modification circuit for producing a control signal to control switching of the switching regulator.

* * * * *